(12) United States Patent
Hauser et al.

(10) Patent No.: US 7,589,452 B2
(45) Date of Patent: Sep. 15, 2009

(54) SAW-COMPONENT HAVING A REDUCED TEMPERATURE PATH AND METHOD FOR THE PRODUCTION THEREOF

(75) Inventors: Markus Hauser, Feldafing (DE); Ulrich Knauer, Munich (DE); Anton Leidl, Hohenbrunn (DE); Evelyn Riha, Nussdorf (DE); Gerd Riha, Nussdorf (DE); Ulrike Rösler, Hebertshausen (DE); Werner Ruile, Munich (DE); Clemens Ruppel, Munich (DE); Gerd Scholl, Hamburg (DE); Ulrich Wolff, Kaiserslautern (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 11/574,904

(22) PCT Filed: Aug. 18, 2005

(86) PCT No.: PCT/EP2005/008964

§ 371 (c)(1),
(2), (4) Date: Aug. 30, 2007

(87) PCT Pub. No.: WO2006/032335

PCT Pub. Date: Mar. 30, 2006

(65) Prior Publication Data
US 2007/0296306 A1 Dec. 27, 2007

(30) Foreign Application Priority Data
Sep. 17, 2004 (DE) .................. 10 2004 045 181

(51) Int. Cl.
H03H 9/25 (2006.01)

(52) U.S. Cl. .................. 310/313 R; 310/340

(58) Field of Classification Search ............. 310/313 R, 310/340
See application file for complete search history.

(56) References Cited

U.S. PATENT DOCUMENTS

| 3,965,444 | A | | 6/1976 | Willingham et al. |
| 5,814,918 | A | * | 9/1998 | Nakahata et al. ........ 310/313 R |
| 5,838,089 | A | * | 11/1998 | Dreifus et al. ........... 310/313 A |
| 5,998,907 | A | * | 12/1999 | Taguchi et al. .......... 310/313 R |
| 6,046,656 | A | * | 4/2000 | Mishima .................... 333/141 |
| 6,806,795 | B2 | * | 10/2004 | Shin .......................... 333/193 |
| 7,034,433 | B2 | * | 4/2006 | Kadota et al. ........... 310/313 A |
| 7,224,101 | B2 | * | 5/2007 | Mishima et al. ......... 310/313 A |

(Continued)

FOREIGN PATENT DOCUMENTS

DE 196 34 979 3/1998

(Continued)

OTHER PUBLICATIONS

Written Opinion for PCT/EP05/008964.

(Continued)

*Primary Examiner*—Thomas M Dougherty
(74) *Attorney, Agent, or Firm*—Fish & Richardson P.C.

(57) ABSTRACT

Elements and methods for forming elements that operate with acoustic waves are disclosed. The element includes a piezoelectric electric substrate that has a first thermal coefficient of expansion, electrically conducting element structures on an upper side of the substrate, a compensation layer on an underside of the substrate, and an $SiO_2$ layer over the element structures.

19 Claims, 3 Drawing Sheets

U.S. PATENT DOCUMENTS

| | | | | |
|---|---|---|---|---|
| 7,322,093 | B2 * | 1/2008 | Kadota et al. | 29/594 |
| 7,439,649 | B2 * | 10/2008 | Fujii et al. | 310/313 R |

FOREIGN PATENT DOCUMENTS

| | | |
|---|---|---|
| EP | 0 353 073 | 7/1989 |
| EP | 0 616 426 | 3/1994 |
| JP | 55-159612 | * 12/1980 |
| JP | 5-335879 | * 12/1993 |
| JP | 05-343193 | 12/1993 |
| JP | 11-155347 | 6/1999 |
| JP | 2001-053579 | 2/2001 |

OTHER PUBLICATIONS

Search Report for PCT/EP05/008964.

G. Kovacs et al. "A SAW Duplexer with Superior Temperature Characteristics for US-PCS" Ultrasoncis Symp. 2004, IEEE Montreal Canada, pp. 974-977.

H. Sato et al. "Temperature Stable SAW Devices Using Directly Bonded LiTaO3/Glass Substrates" IEEE Ultrasoncis Symposium Proc. NY, NY IEEE, US, Bd. vol. 1, May 10, 1998, pp. 335-338.

Kengo Asai et al. "Experimental and Theoretical Investigation for Temperature Characteristics and Propagation Losses of SAWs on SiO2/Al/LiTaO3" IEEE Ultrasoncis Symposium, 2002, pp. 235-238.

Kazuo EDA et al "Novel Composite Piezoelectric Materials Using Direct Bonding Techniques" IEEE Ultrasoncis Symposium, 1995, pp. 921-924.

Falk Herrmann et al "Temperature-compensated Love Mode Sensors Based on Quartz/SiO2 and LiTaO3/SiO2 Systems" Proc. of SPIE-The International Society for Optical Engineering, vol. 4205, 2001, ISSN 0277-786X.

K. Onishi et al. "A Novel Temperature Compensation Methods for SAW Devices Using Direct Bonding Techniques" IEEE Ultrasoncis Symposium, 1997,pp. 227-230.

M. Lewis "Temperature Compensation Techniques for SAW Devices" IEEE Ultrasoncis Symposium, 1979, pp. 612,622.

Iyler et al "Silicon Wafer Bonding Technology for VLSI and MEMS Applications" IEEE Institution of Electrical Engineers, 2002, ISBN 0-85296-039-5.

English translation of Written Opinion for PCT/EP2005/008964.

* cited by examiner

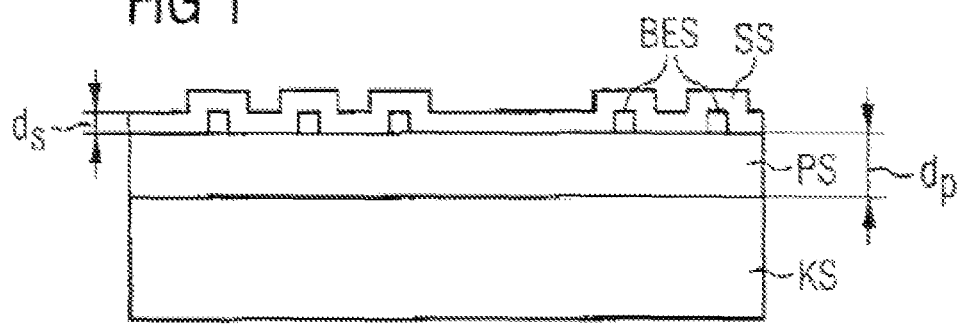
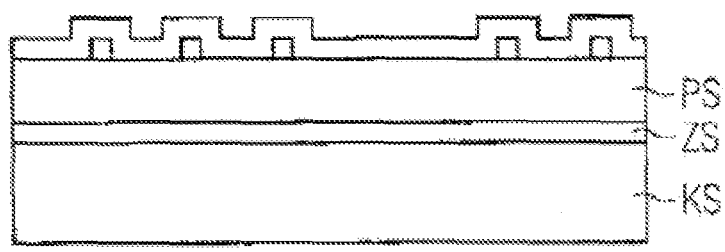
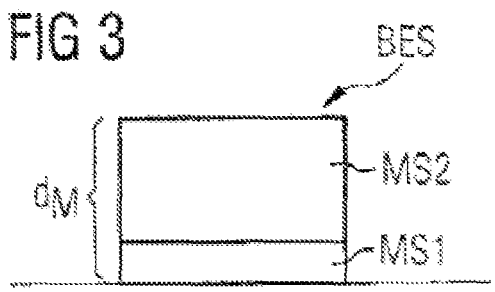
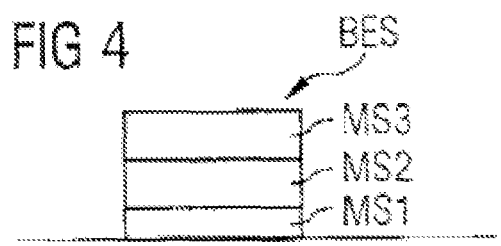

SAW-COMPONENT HAVING A REDUCED TEMPERATURE PATH AND METHOD FOR THE PRODUCTION THEREOF

BACKGROUND

Frequency-related properties of SAW elements such as the center frequency for the most part exhibit a dependence on temperature, which is typically 40 ppm/K, for example. This is because as a rule if there is an increase in temperature, thermal expansion of the substrate takes place and leads to an increase of the electrode spacing in the case of interdigital transducer structures. Since this spacing determines the center frequency of the transducer and thus of the SAW element, the wavelength also increases, and the center frequency becomes lower. However, a change of the acoustic frequency is also connected with the thermal expansion since the elastic properties of the piezomaterial also change with thermal expansion. On top of that, most of the usually used piezoelectric wafer materials show significant anisotropy and have a temperature drift of properties that are dependent on the crystal axis.

In order to ensure functionality of an SAW element over a larger temperature range in spite of the temperature drift and the temperature-related drift of the center frequency, the bandwidth of the element usually has to be increased. The production of narrow-band frequency-exact temperature-independent SAW elements therefore is practically not possible with substrates like lithium tantalate or lithium niobate. However, the temperature drift is a problem for filter applications and must be minimized as much as possible.

Various measures have already been proposed to compensate the temperature drift of piezoelectric substrate materials. One possibility is to bond the piezoelectric wafer to a substrate material in a mechanically solid way and to brace it thermally. If the substrate material is appropriate selected, a certain compensation of the temperature drift can be achieved through the bracing. The compensation usually takes place so that an increase of the acoustic velocity of the acoustic surface wave used for the element is linked to the thermal expansion in the bracing material. Silicon, for example, is known as a bracing material for this.

Another possibility is to apply a dielectric layer of silicon oxide to the substrate surface and, for example, over the electrode structures, for example, by deposition from the gas phase. Depending on the properties of the layer, a temperature compensation can be achieved starting with a layer thickness of about 20 to 35% with respect to the wavelength of the SAW propagating in it. However, a disadvantage with this solution is the high stress caused by the weight of the layer and the high damping of the SAW caused by such a thick layer.

SUMMARY

An element operating with acoustic waves that has reduced temperature drift without overly degrading other properties of the element due to this is disclosed.

An element that operates with acoustic waves in which two independent measures are combined so that the desired effect of a minimized temperature drift is achieved without disadvantages linked to the individual measures arising at the same time.

The element includes a piezoelectric substrate, which has a relative thickness of 5 to 50 wavelengths of the acoustic wave capable of propagating in the element at the center frequency of the element. Electrically conducting element structures are applied to the surface of the substrate in a substantially known way. A compensation layer that is mechanically braced with the substrate that develops a mechanical bracing with respect to the substrate when the temperature changes is firmly bonded to the underside of the substrate.

Advantageously, the thermal coefficient of expansion TCE1 of the substrate is smaller than the thermal coefficient of expansion TCE2 of the compensation layer.

In this way a mechanical bracing of the piezoelectric substrate that changes the temperature drift of the elastic properties of the piezoelectric substrate is achieved. This bracing acts only via the change of the elastic parameters, is relatively independent of the thermal expansion of the piezoelectric material itself and nevertheless leads to a reduction of the temperature drift of the frequency.

A $SiO_2$ layer is arranged over the element structures in a thickness of 5 to 20% of the acoustic wave capable of propagating in the element. This $SiO_2$ layer has a different effect than the compensation layer. It is arranged on the substrate so that the acoustic wave in part propagates within the $SiO_2$ layer. With that the acoustic velocity in the layer and the temperature drift of the $SiO_2$ layer itself are decisively responsible for the temperature drift of the overall element. Here, too, it is not crucial for the $SiO_2$ layer to have a suitable thermal coefficient of expansion, but rather that it have a low temperature drift of frequency. Preferably, the $SiO_2$ layer is exclusively in an amorphous modification without any long range order and has high uniformity.

The two measures result in the corresponding elements having a temperature drift of frequency that ranges from slight up to completely compensated. Since both measures independently make their relevant contributions to the temperature drift, or to reducing the temperature drift, they do not mutually have an effect and they add up independently of one another so that a temperature compensation not previously achieved is obtained. The contribution of each of the individual measures can by itself be lower than would be necessary if only one of the measures were used by itself. In this way in particular in the case of the $SiO_2$ layer, a layer thickness that is too high and thus too great a damping of the acoustic wave and with that an adverse effect on the properties of the element are avoided. Since the piezoelectric substrate has a relatively low layer thickness, the bracing with the compensation layer also does not lead to an impermissibly high bending because of the bimetal effect. The element remains sufficiently flat even with temperature change so that particularly the production of the element is not made more difficult. In addition, particularly fine electrically conductive element structures can easily be applied to the piezoelectric layer bonded to a compensation layer by using a high-resolution process without the precision of the structure suffering because of this.

In an embodiment a solid body that is bonded to the piezoelectric substrate is used as the compensation layer. The so called wafer bond processes enable an especially intimate connection between two flat or form fitting connectable surfaces. Through the intimate bond an especially good bracing of the piezoelectric layer by the compensation layer is enabled, which enables a maximum effect with regard to reduction of the temperature drift.

However, it is also possible to provide a thin intermediate layer between the piezoelectric substrate and the compensation layer. Additional advantages can be achieved with such an intermediate layer or disadvantages can be compensated by the composite substrate that now exists. Such an intermediate layer can be, for example, an antireflective layer. Such a layer helps to minimize reflections occurring on the underside of the substrate in the phototechnical formation of structures on the upper surface of the piezoelectric substrate, which [reflections] otherwise lead to the formation of interfering structures and thus to an imprecise and unsharp form of the structures of the element. An antireflective layer therefore is a layer that absorbs light or a λ/4 layer (where λ here is the wavelength of the light used to produce the structures), which does indeed generate a reflection on both boundary surfaces, but this reflection is damped because of the appropriately chosen thickness of the layer and the phase shift that is achieved through this. It is also possible to design the antireflective layer as a combination of layers, each optionally formed with a λ/4 layer thickness. λ/4 layers are particularly effective, for example, if an especially good reflection arises at the boundary surface of these layers. This is achieved if the refractive index in the transition into the λ/4 layer or in the transition from a first λ/4 layer into the adjacent layer undergoes a particularly high change. Therefore, a combination of a number of λ/4 layers that have highly different refractive indices is advantageous.

Another advantage can be obtained if the intermediate layer, or, optionally, one of a number of intermediate layers, has low conductivity and for this purpose is formed to be, for example, high-ohmage. In this way it is possible to distribute or drain charges that arise on the underside of the piezoelectric substrate, as can occur in the case of a pyroelectric substrate material. In this way one avoids pyroelectric charges leading to high electrical potential differences and voltages within the element, the discharge of which can damage or even destroy the element.

In another embodiment the intermediate layer or one of the intermediate layers can be designed to be semiconducting or conducting only under certain conditions. For example, it is possible to provide the layer as a semiconductor or as an optically activateable layer.

Another property that can be realized in such an intermediate layer is suppression of a reflection from acoustic volume waves, which are generated quasi parasitically as undesirable perturbation waves by the element structures. Their reflections lead to an interference signal in the element structure. Reflections can be prevented with a suitably formed intermediate layer by the intermediate layer acting, for example, as an acoustic antireflection processing layer. Such an antireflection processing effect can be achieved if dielectric layers with appropriate acoustic impedance and layer thickness are used. However, it is also possible to structure the intermediate layer so that an acoustic volume wave is scattered at the boundary surface and thus robbed of a great portion of its interference effect.

When using an intermediate layer it is in some cases not possible to bond the piezoelectric substrate and the compensation layer to each other by direct bonding. For this reason it is proposed that the compensation layer and substrate be joined with the help of an adhesive layer. If the adhesive layer is made in a appropriate layer thickness, it can satisfy one of the purposes mentioned above as an optical antireflective layer or as an acoustic antireflective layer. An adhesive layer is also suitable for bonding piezoelectric substrates with roughened surfaces (to prevent acoustic reflections) to optionally likewise roughened surfaces, for example to the compensation layer, which cannot be bonded in a form-fitting way by bonding alone and therefore cannot become firmly bonded to each other.

The structures of the element are preferably generated after bonding the piezoelectric substrate and compensation layer to the composite substrate. However, it is also possible to bring the layer thickness of the piezoelectric layer to a suitable relatively low thickness after generating the composite substrate by means of a thinning process, and only then to generate the element structures.

Standard metallizations can be used for the element structures, especially aluminum, aluminum-containing alloys or multilayer systems that chiefly contain aluminum or an aluminum alloy. However, it was found that the metallization of surface wave elements also affects the frequency and loses of these components. The frequency is determined by the physical properties of the metallization, which has an effect on the velocity of the wave in the metallization, by the geometry-dependent quantities like layer thickness and metallization thickness, and also by the mechanical bracing of the strips substrate via the metallization. All quantities that affect the frequency of the component also affect the temperature dependency of the frequency. Through appropriate choice of metallization parameters it is thus possible to minimize the TCF even further. Losses in the element that are caused by the metallization increase its temperature and thus also affect the frequency. A decrease of electrical losses in the metallization therefore also leads to a decrease of temperature-conditioned frequency deviations.

The velocity of the acoustic wave within a metallization is determined above all by the elastic constants and their temperature dependence within the metallization. Metals like copper, molybdenum, chromium, gold, tungsten, silver and tantalum, or alloys of these metals have elastic constants that have only a low dependence on temperature. Advantageous metallizations for components with low TCF therefore contain one or more layers of metals or alloys containing these metals from this selection. Compared to a standard metallization of aluminum, advantages are already achieved if a metal with higher density is used in a layer.

A metal with elastic constants having very low temperature-dependence, which thus reduces the TCF of an element provided with such a metallization, is an alloy known as ELINVAR, which contains a composition of 50% Fe, 42% Ni, 5.3% Cr, 2.5% Ti, and in addition C, Mn, Si, Al and Cu, and which can be used in various elements.

It turned out that lower metallization layer thickness brings about a lower temperature drift of frequency. Since in the design of SAW elements the mass load is a crucial factor, an identical mass load can be achieved with a metal of higher density at a lower layer thickness. Metallizations that are suitable in this regard therefore include Cu, Mo, W, Au, Ag, Pt and Ta.

Since the effect of the metallization on the TCF and other parameters of the element is dependent on the proportion of the acoustic wave that passes within the metallization, the dependency of the properties of the element on the metallization can therefore be reduced via a lower metallization ratio. An element with lower metallization ratio η contains less metal, which thus has a lower effect on the frequency and the TCF of the element.

Strains arise in a multilayer system when materials with different temperature-dependent expansion of length (TCE) are used in combination. A piezoelectric substrate of lithium tantalate in combination with practically all other materials displays strain, since it has a direction-dependent TCE, that develops differently along different crystal axes. The lowest strain in a layer bond with piezoelectric materials is achieved with layers or metallizations whose TCE is matched to a crystal axis specific TCE of the piezoelectric substrate. From this point of view, metals like Cu, Ti, Mo, Cr, W, Pt and Ta are especially suitable as metallizations or components of metallization in a combination with lithium tantalate as substrate.

The self-heating of an SAW element is reduced by reducing acoustic and electrical loses. While acoustic losses are affected by the design of the element, electrical losses are essentially determined by the specific electrical resistance and the thickness of the layer of metallization. Since a greater layer thickness is indeed favorable for the total resistance, but for the reasons given above contradicts the requirements of a lower TCF, an advantageous metallization is selected as a compromise between minimal losses and minimal layer thickness. Metallizations that are suitable from this point of view therefore include materials like Al, Cu, Mg and Ag.

If the metallizations of SAW elements are designed as multilayer systems, one can combine the positive aspects of individual layers. Advantageously, for example, the first metal layer deposited directly on the substrate has a low dependency of its elastic constants on temperature, a low thermal coefficient of expansion and, at the same time, high density. A large portion of the acoustic energy is localized in the undermost layer of a metallization, so that the greatest effect on the TCF of the overall element is achieved with this undermost layer. The metals Cu, Mo, W, Au or Ta are then especially preferred as undermost layer. Optionally, the undermost electrode layer is deposited over a relatively thin adhesive layer, which can consist of Al or Ti. Preferably one or more layers with good electrical conductivity are used over the first metallization layer in order to keep electrical losses low. In combination with said first layer, layers or layer systems of aluminum, aluminum alloys, Cu, Mg and Ag are then highly suitable.

An element utilizes the bracing effect that results from the bracing of the piezoelectric substrate with the compensation layer to reduce the TCF. The bracing of the element with a compensation layer in particular has an effect on the elastic constants of the bond and its temperature dependency, with the help of which again the TCG, thus the temperature dependence of the frequency in the overall element can be advantageously reduced.

Since the effect of the bracing decreases with increasing distance from the boundary layer and the acoustic wave propagates on the side of the piezoelectric substrate that is turned away from the bracing layer, a maximum effect of bracing on the TCF is achieved with a thin piezoelectric substrate, which does not exceed a thickness of about 50 µm. Advantageously a lower limit is also maintained for the layer thickness of the piezoelectric substrate, which is chosen so that the deflections of the surface wave in the substrate at the boundary layer with the compensation layer are damped. This lower limit is a few wavelengths, and therefore in absolute figures is also a function of the center frequency of the element. For example, an advantageous lower limit for the layer thickness is said to be 5 wavelengths, which in the case of an element with center frequency 2 GHz corresponds to about 10 µm.

Since the compensation layer acts only via the bracing effect, a large number of preferably inorganic materials are possibilities for it. These are in particular materials that have a thermal coefficient of expansion TCE2 less than the coefficient of expansion of TCE1 of the substrate. For the commonly used single-crystal substrate materials lithium tantalate (LT) and lithium niobate (LN), which, depending on the crystal section have anisotropic heats of expansion from about 4 to about 16 ppm/K (LT) and 7 to 15 ppm/K (LN), materials that are possibilities for the compensation layer are ones with preferably correspondingly low coefficients of expansion, especially materials with a coefficient of expansion less than 4 ppm/K. The advantageous effect of the compensation layer on the TCF will be higher, the lower the thermal coefficient of expansion TCE of the compensation layer is.

In the case of glasses, the TCE can be affected simply and significantly through the appropriate composition. Quartz glass with a silicon dioxide content of more than 99.9%, for example, only has a TCE of 0.5 ppm/K, while glasses containing lead oxide and other oxides have TCEs of 9.8 ppm and higher. With specialty glasses such as the glasses known under the trade names Zerodur® and Astrosital®, a TCE of 0 or 1 to $2\times10^{-7}$ ppm/K is measured. Ordinary and more available glasses such as E6 from Ohara, 7740 from Corning or Boroflat® from Schott have a TCE of about 3 ppm/K and therefore are suitable as materials for the compensation layer.

Crystalline and ceramic materials that have low TCEs are also known. For example, silicon (3.2 ppm/K), silicon nitride (2.5-3 ppm/K) and specialty ceramics like $Al_2TiO_5$ (0-1 ppm/K) are well-suited for the compensation layer.

In an advantageous embodiment, a housing for the element is made of one of said materials and the element is firmly bonded to the compensation material, here the housing bottom or top, by gluing or bonding an appropriately thin chip or a piezoelectric substrate provided with the structures of the element. However, a prerequisite for the effectiveness of the bracing is, as mentioned, a relatively low thickness of the piezoelectric layer or the piezoelectric substrate.

A piezoelectric substrate braced with a compensation layer tends, because of the "bimetal effect" to distort when there are temperature changes. These distortions impede the machining of the substrate with high precision machinery. Advantageously, the piezoelectric substrate is bonded to the compensation layer at a temperature that corresponds to the temperature at which the metallization is produced, and thus, to the finger structures for the electroacoustical transducers that are critical with respect to small measurements. In doing so one starts from the assumption that at the temperature of the bonding process no strain and thus no distortion of the bond is observed. Since the finger structures are usually produced at room temperature, an element is preferably also bonded to the compensation layer at room temperature.

Another aspect of the element includes the mechanical forces that can arise between the piezoelectric substrate and the compensation layer because of the bracing. Advantageously, the TCE of the compensation layer is chosen so that the forces that arise when there is distortion do not lead to destruction of element structures or to separation of soldered connections. This is achieved possibly by reducing the difference between the TCE of the compensation layer and the TCE of the substrate or by making the connection between the compensation layer and the substrate flexible with the help of an elastic intermediate layer. Fewer distortions also occur if a correspondingly thick and/or mechanically stable compensation layer is used and bonded sufficiently firmly to the piezoelectric substrate. Such a bond can survive unharmed at the temperatures that occur, for example, in the soldering of the chip to a circuit board. A compromise between ease of fabrication and achievable frequency stabilization is achieved if LT is used as substrate material with material for the compensation layer that has a TCE of about 1 to 13.5 ppm/K.

The total thickness of substrate and compensation layer is advantageously less than 400 µm.

Preferably a compensation wafer is used for the compensation layer and can be and is bonded to the piezoelectric wafer of the substrate in a bonding process. Preferably a direct bonding process is used as the bonding process. It is also possible to use thin intermediate layers in the region of the boundary surface between the two wafers, via which better adhesion is brought about. Such intermediate layers can be, for example, oxide or metal layers. Gluing between substrate wafer and compensation wafer is also possible. Suitable bonding processes are, for example, direct wafer bonding, gluing or adhesive processes, epitaxial bonding, lift off, anodic or eutectic bonding.

Another aspect of the elements is the $SiO_2$ layer that is applied over the structures of the element, thus over the metallizations. Its elastic constants have a positive temperature coefficient. With an ideal $SiO_2$ layer that has a precise stoichiometry and no long-range order, complete compensation of the TCF is achieved starting with a layer thickness of 20 to 35% of the acoustic wavelength that is capable of propagating in the layer. Overcompensations are observed even with thicker layers. However, the layers have the disadvantage that they produce acoustic damping, which leads to losses. Therefore, the $SiO_2$ layer has a smaller layer thickness of 5 to 20%.

The optimum thickness of the $SiO_2$ layer is also a function of the height of the metallization and the intensity of the metallization. If the thickness of the $SiO_2$ layer remains the same, therefore, an optimum value in each case can be chosen for the metallization height and metallization intensity.

Another limiting condition for SAW elements is the reflectivity of the electrode fingers. While a traditional electrode finger with metal layer thickness of 4% on LT has a reflectivity of 5% per finger (without the $SiO_2$ layer), at a 20% thick $SiO_2$ layer the reflectivity decreases to a value of about 2.3% reflectively per finger, thus to less than half. This decrease in reflectivity is observed for all layer thicknesses between 2 and about 10% of the relative metallization thickness. Since the reflectivity is an important property of SAW elements, should have a certain minimum value and is frequency determining for the element, the reflectivity is further improved with another embodiment. With the help of a conforming deposition of the $SiO_2$ layer, which runs overall in conforming fashion to the surface or to the topography of the substrate or the metallizations deposited thereon, with a metallization of about 4% relative thickness, now an increased reflectivity of about 6.3% per electrode finger is even seen.

Conforming $SiO_2$ layers are obtained by setting appropriate deposition parameters. For this, in particular the starting materials, the pressure, temperature, the carrier gas that is used and, in the case of sputtering, the applied bias voltage are appropriately adjusted. Suitable methods for producing such conforming $SiO_2$ layers are sputtering and PECVD.

In contrast to an ideal $SiO_2$ layer with precise stoichiometry and exclusively amorphous modification, an actually produced $SiO_2$ layer always contains a certain amount of SiO that is in the range of 0.5 to 5 %. The refractive index also increases with increasing $SiO_2$ content and for this reason can be employed for characterization of $SiO_2$ layers. $SiO_2$ layers can have a refractive index in the range of 1.44 1.49 at a wavelength of 632.8 nm, whereas an ideal $SiO_2$ has a refractive index of 1.456 at said wavelength.

In the deposition of $SiO_2$ layers by means of sputtering or PECVD processes, defects and pores can arise that do not assure that the layer will have the desired quality. However, they can be remedied subsequently by healing. The healing is carried out at an elevated temperature, which is limited from above in dependence on the materials used for metallization. For example, for an aluminum containing metallization the healing is carried out at a maximum of 400° C.

In producing the $SiO_2$ layer it is additionally advantageous to minimize the deposition temperature in order to minimize the compressive strain that arises upon cooling. Properties of the SAW elements can be degraded with compressive strain that is too high.

The positive effect of the $SiO_2$ layer lies in the fact that it exhibits the desired positive temperature coefficients of acoustic delay, while the piezoelectric substrates usually show negative temperature coefficients of acoustic delay. The SAW velocity is lower in the $SiO_2$ layer than, for example, in LT. Therefore, the wave preferably propagates at the boundary surface between the $SiO_2$ layer and the substrate.

Another advantage of these measures is that the $SiO_2$, as a good dielectric material, has high breakdown strength, about 1 $MV/mm^2$. The ESD strength is thus increased. This is also present at the "rounding" of the finger edges due to the layer applied thereon. In addition, the dielectric constant of $SiO_2$, 3.9, is about 4 times as great as that of air, which further increases the dielectric strength. Moreover, the hard $SiO_2$ layer also acts as protection against particles, for example against a short circuit caused by metal particles from a production process.

As already noted, the reflectivity per electrode finger is increased by a closely conforming deposition of the $SiO_2$ layer. This is because now the surface of the $SiO_2$ layer also has a topography that at least partially follows the topography of the electrode fingers and therewith has a reflectivity of its own, or increases the total reflectivity.

In another embodiments, the topography on the surface of the $SiO_2$ layer is created by subsequent structuring and other measures. In doing so the periods, relative finger widths, edge angles or edge shapes of the elevations on the surface of the $SiO_2$ layer are varied.

By varying the edge angle of the metallization structures, thus the electrode fingers themselves, improved deposition of the $SiO_2$ layer and especially better edge coverage is possible. While known $SiO_2$ layers have a severe tendency to crack starting with a certain layer thickness, the $SiO_2$ layer with an edge angle of the metallization that departs from 90° and thus has topography that follows this edge angle, counteracts this and in this way cracks are avoided. A $SiO_2$ layer over element structures with sloping, for example 75° inclined, edge angles clearly has fewer cracks than a layer of the same thickness with conventional edge angles of 90°. Alternatively, with a metallization edge angle less than 90° the thickness of the $SiO_2$ layer can be increased and the compensation of the TCF can be improved, without a higher degree of cracking occurring.

The elevations in the $SiO_2$ layer preferably have the same periodicity as the electrode fingers of the metallization structure. In each case according to the desired reflection, this structure can be designed to be pyramidal or trapezoidal and have a width that is different from the metallization structure but smaller than the electrode spacing, so that a flat region parallel to the substrate remains between the elevations of the $SiO_2$ layer.

Another improvement of the $SiO_2$ layer is obtained when a vapor barrier in the form of nitrogen-containing $SiO_2$ is integrated in particular into the upper region of the layer. Such a vapor barrier of $Si_xN_yO_2$ can be produced in the same reactor by adding nitrogen-containing starting components. Preferably the nitrogen content is continually increased during fabrication in the deposition reaction in order to obtain a high layer uniformity.

The invention is illustrated in more detail below by means of embodiment examples and the pertinent figures. The figures serve only for better illustration of the invention and are

DESCRIPTION OF THE DRAWINGS

FIG. 1 shows a first element.
FIG. 2 shows an element with an intermediate layer.
FIG. 3 shows an element structure with two different metallization layers.
FIG. 4 shows an element structure with three different metallization layers.

DETAILED DESCRIPTION

FIG. 1 shows a first element in schematic cross section. A piezoelectric layer PS is firmly bonded to a compensation layer KS. The material of the compensation layer KS is chosen so that its thermal coefficient expansion TEC2 is less than the coefficient of expansion TCE1 of the piezoelectric layer. Structural elements BES are applied to the piezoelectric layer, for example interdigital converters with strip shaped finger electrodes, which are represented in the figure in a cross section transverse to the lengthwise direction of the electrode fingers. Over the element structure BES and the surface of the piezoelectric PS is applied a $SiO_2$ layer SS in a thickness that is between 5 and 20% of one of the wavelengths capable of propagating in the layer at the center frequency of the element. The layer thickness dP of the piezoelectric layer PS is roughly 5 wavelengths. The compensation layer KS is thicker than the piezoelectric layer and dimensioned so that the resulting total thickness of the piezoelectric layer and compensation layer KS is less than 400 µm.

FIG. 2 shows another embodiment, in which an intermediate layer is [ZS] is arranged between the piezoelectric layer PS and the compensation layer KS. This intermediate layer can serve for better adhesion between the piezoelectric layer and the compensation layer. However, it is also possible for the intermediate layer to fulfill additional element functions, in particular to have certain optical and acoustic properties and optionally electrical conductivity. The intermediate layer can also be designed as an adhesive layer.

FIG. 3 shows a section through a two-layer element structure. It has a first metal layer MS1 sitting directly on the piezoelectric substrate and made of a metal with relatively high density, and a second metal layer MS2 of a metal of lower density. The total height dM of the element structure BES is, measured in wavelengths, about 4 to 10% of the wavelength of the wave capable of propagating in the element.

FIG. 4 shows another element structure, which has a multilayer design, in particular three layers here, and has a first metal layer MS1, a second metal layer MS2 and a third metal layer MS3 and, optionally, additional layers over these.

FIGS. 5a to 5d show details of an element with different topographies of the element structure. The topographies that are shown can be produced via a suitable layer generation process for the $SiO_2$ layer. However, it is also possible to deposit the $SiO_2$ layer in a planar fashion and to structurize it in a second step with a suitable process so that the desired topography arises.

Figure 5A:
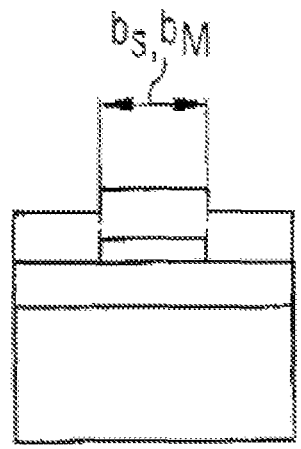
FIG. 5 shows sections with the $SiO_2$ layer having different topographies.

FIG. 5a shows a first simple embodiment, in which the topography of the $SiO_2$ layer corresponds to that of the element structure. In particular, the $SiO_2$ layer has an elevation over the element structure that has a width $b_S$ that is roughly the width of the element structure $b_M$. The edge angle of the element structure BES and the elevation of the $SiO_2$ layer SS are each about 90°. Here the reflectivity per finger is over 6%, thus higher than in the case of an element without a $SiO_2$ layer.

Figure 5B:
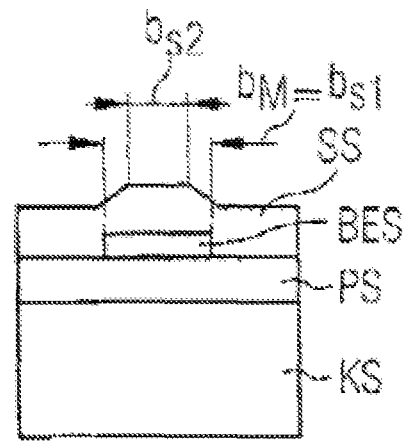

FIG. 5b shows a design in which the elevations of the $SiO_2$ layer have a non 90° edge angle and therefore overall have a trapezoidal shape in cross section. The lower width of the elevation BS1 in the $SiO_2$ layer SS corresponds roughly to the width of the element structure BES. The upper edge of the elevations of the $SiO_2$ structure above the element structure have a width BS2 that is less than BS1. Such a structure can be varied to the extent that BS1 is greater than $b_M$. The edges can be flattened with a back-sputtering process that is integrated into the process by increasing the bias voltage during deposition.

Figure 5C:
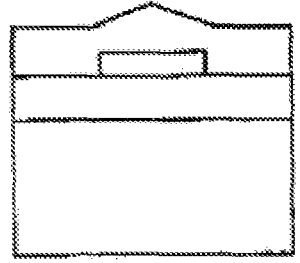

FIG. 5c has, in the $SiO_2$ layer, a pyramid shaped elevation above the element structure. Here, too, the lower width of the elevation, thus the width of the base of the pyramid, is roughly equal to the width of the element structure, but it can deviate from it in either way. The flattening can be achieved by back-sputtering here, too.

Figure 5D:
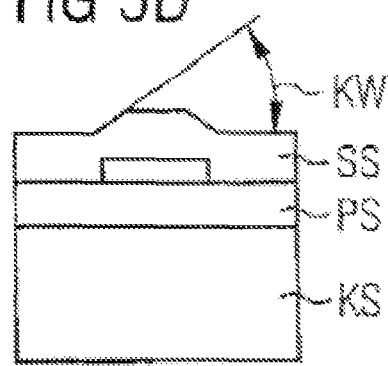

FIG. 5d shows a design in which the $SiO_2$ layer over the element structure has an elevation with a trapezoidal cross section, where the edge angle is chosen to be in the region of about 25°. The pertinent element structure here has an edge angle of 90°.

Figure 6A:
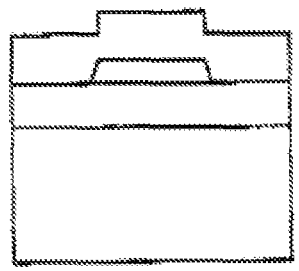
FIG. 6 shows, in sections an element with sloping edges of the element structure.
Figure 6B:
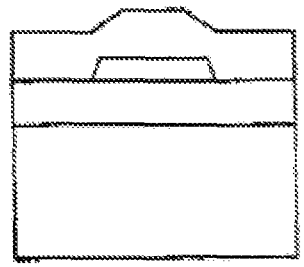

FIG. 6 shows two embodiment examples in which the edge covering of the $SiO_2$ layer over the element structure is improved by setting the edge angle of the element structure to an angle less than 90°. Such an angle is chosen to be, for example, in the range between 65 and 85° and is, for example, 75°. While in FIG. 6A an elevation in the $SiO_2$ layer over the element structure is designed with a 90° edge angle, this elevation in the example in FIG. 6B has a smaller edge angle, which corresponds, for example, to the edge angle of the element structure. With a $SiO_2$ layer of 20% relative thickness over an LT substrate and with Al metallization of relative height 4%, reflectivities of over 5.9% per finger can be achieved with edge angles of the elevations and of the element structures of 75° each in the elements. Depending on the method chosen to deposit the $SiO_2$ layer, the edge angle of the elevation in the $SiO_2$ layer can, however, be smaller than that of the element structure.

FIG. 7 shows another embodiment, in which the housing is additionally also used as a compensation layer. In such designs the piezoelectric substrate PS with the element structures and the $SiO_2$ layer over them is firmly bonded to the housing part that is intended to serve as the compensation layer. The bonding is preferably made by direct bonding, as in the embodiments with a pure compensation layer. However, other mechanically firm connections that can serve for bracing between the housing part that serves as compensation layer KS and the piezoelectric substrate PS are also possible. For example, soldering processes, gluing processes or bump connections are suitable. In addition to the compensating housing, as always, a flat substrate like compensating layer can also be used facing the surface of the substrate carrying the element structure.

Figure 7A:
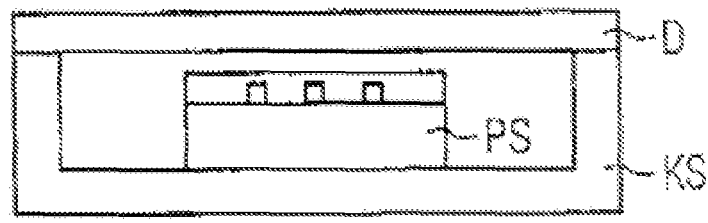
FIG. 7 shows an element structure with a housing that is used as compensation layer.
Figure 7B:
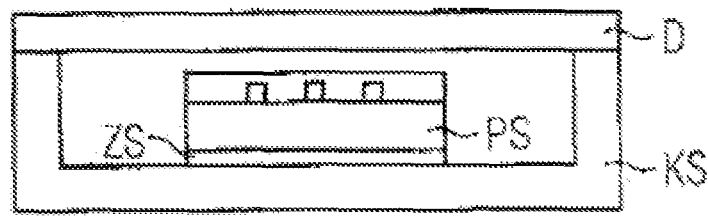

FIG. 7A shows an embodiment in which the piezoelectric substrate PS is used in the bottom section of a housing designed as a pan and is firmly bonded to it as the material that serves as the compensation layer KS. The material of the lower section of the housing is designed according to the same criteria as the compensation layer illustrated above. The housing lower section can be closed with flat cover D, as shown in FIGS. 7a and 7b. However, it is also possible to apply the piezoelectric substrate PS to a flat housing lower section, which likewise can serve as compensation layer KS.

Figure 7C:
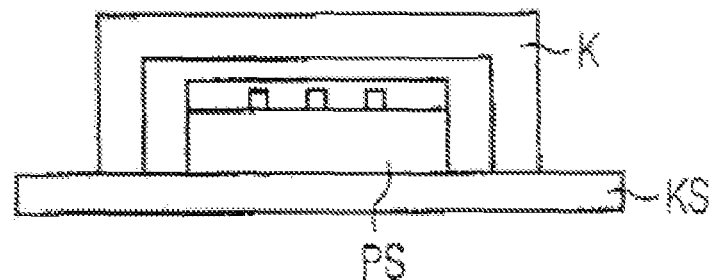

FIG. 7c shows such an embodiment, where the element is then sealed by a cover that is firmly locked to the housing lower section. FIG. 7c shows a mechanically firm cap K. However, the cover can also be in the form of a film and in particular laminated. It is clear that the material for the housing lower section that is intended to serve as compensation layer KS is subject to the same criteria with regard to choice of material as the compensation layer described above that is directly applied to the piezoelectric substrate. In these cases the housing can contribute to a reduction of the TCF. If the upper part of the housing, especially the cover D or the cap K is made of a suitable material, it can contribute further to bracing thus to a further reduction of the TCF.

Figure 7D:
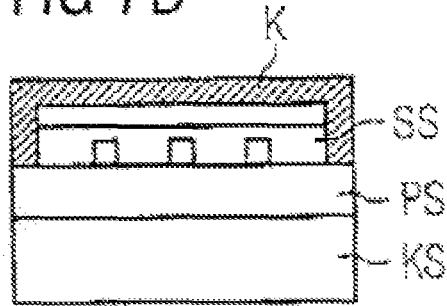

FIG. 7D shows another embodiment, in which the element is provided with a compensation layer KS that does not have any additional housing functions. However, in addition the element is covered above the element structure or above the $SiO_2$ layer with a cap K, the material of which is chosen so that relative to the piezoelectric material of the piezoelectric layer PS, a thermal bracing can appear. The cap sits directly on the piezoelectric layer PS. The cap can also comprise a cover layer. It is also possible with that to have a favorable effect on the TCF of the overall element and to minimize the effect of temperature on the position of the resonance frequency.

Although embodiments were described above using a few embodiment examples, it is not limited to these. Possible variations result from the type and design of the compensation layer, the intermediate layer, the precise design of the element structures and from the housing in which the element is possibly incorporated. It is common to all embodiments that they achieve a considerable improvement of the temperature dependency of the resonance frequency with the characteristics given without completely exhausting the possibilities of an individual measure for this and having to accept the related disadvantages in exchange. Thus the elements described herein can have excellent element performance and considerably improved or reduced temperature dependence of the resonance frequency.

Although the invention was described only by means lf a few embodiment examples, it is not limited to these. Possible variations result from the type and design of the compensation layer, the intermediate layer, the precise design of the element structures and from the housing in which the element is possibly incorporated. It is common to all embodiments that they achieve a considerable improvement of the temperature dependency of the resonance frequency with the characteristics given in accordance with the invention without completely exhausting the possibilities of an individual measure for this and having to accept the related disadvantages in exchange. Thus the invention specifies an element that has excellent element performance and considerably improved or reduced temperature dependence of the resonance frequency.

The invention claimed is:

1. An element comprising:
a piezoelectric substrate having a first thermal coefficient of expansion and a thickness of x times lambda, where 5<x<50 and lambda is a wavelength of the element at a center frequency;
electrically conducting element structures on an upper side of the substrate;
a compensation layer on an underside of the substrate; and
an $SiO_2$ layer over the element structures, wherein the element is configured to be operated using an acoustic wave and the $SiO_2$ layer has a thickness of about 5% to about 20% of a wavelength of the acoustic wave at the center frequency.

2. The element of claim 1, wherein the compensation layer comprises a material having a second thermal coefficient of expansion, the second coefficient of expansion being less than the first coefficient of expansion.

3. The element of claim 1, wherein the compensation layer comprises a solid body bonded to the substrate.

4. The element of claim 1, further comprising an intermediate layer between the substrate and the compensation layer, the intermediate layer having a thickness that is less than a thickness of the compensation layer.

5. The element of claim 4, wherein the intermediate layer comprises one of a high-resistance layer, an antireflective layer and an adhesive layer.

6. The element of claim 1, wherein the element structures comprise a material or material combination having a total density that is greater than a density of pure Al.

7. The element of claim 6, wherein the element structures comprise a multilayer structure comprising layers of Al and layers of at least one of Cu, Mo, W and Ta.

8. The element of claim 6, further comprising:
a first layer comprising one of Cu, Mo, W and Ta on the element structures; and
an electrode body comprising a uniform material or a multilayer structure comprising multiple individual layers, wherein the uniform material or the individual layers of the multilayer structure comprise at least one of Al, Cu, Mg and Ag.

9. The element of claim 1, wherein the compensation layer comprises a glass layer.

10. The element of claim 1, wherein the compensation layer comprises a material having a coefficient of expansion from about 1 to about 3.5 $ppmK^{-1}$.

11. The element of claim 1, wherein a total height of the substrate and the compensation layer is less than about 400 μm.

12. An element comprising:
a piezoelectric substrate having a first thermal coefficient of expansion and a thickness of x times lambda, where 5<x<50 and lambda is a wavelength of the element at a center frequency;
electrically conducting element structures on an upper side of the substrate;
a compensation layer on an underside of the substrate; and
an $SiO_2$ layer over the element structures, wherein the element is configured to be operated using an acoustic wave and the $SiO_2$ layer has a thickness of about 5% to about 20% of a wavelength of the acoustic wave at the center frequency,
wherein:
the element structures comprise strip-shaped electrode fingers having lateral edges at angles to a surface of the substrate; and
lateral edges are at angles between about 65° and about 85° relative to a surface of the piezoelectric substrate.

13. The element of claim 12, wherein:
the element structures comprise strip-shaped electrode fingers having lateral edges at an incline to a surface of the substrate; and the SiO$_2$ layer has a surface structure similar to the structure of the electrode fingers and having about the same spacing as the electrode fingers.

14. An element comprising:

a piezoelectric substrate having a first thermal coefficient of expansion and a thickness of x times lambda, where 5<x<50 and lambda is a wavelength of the element at a center frequency;

electrically conducting element structures on an upper side of the substrate;

a compensation layer on an underside of the substrate; and an SiO$_2$ layer over the element structures, wherein the element is configured to be operated using an acoustic wave and the SiO$_2$ layer has a thickness of about 5% to about 20% of a wavelength of the acoustic wave at the center frequency, wherein:

the compensation layer comprises a support material that is a part of the housing, the support material having a third thermal coefficient of expansion that is less than the first thermal coefficient of expansion; and the support material is connected to the element structures on the surface of the substrate by bumps.

15. The element of claim 14, wherein the support material comprises a multilayer material comprising multiple layers, the multilayer material having at least one metallization level between the layers, and wherein at least one layer comprises ceramic, glass or plastic circuit board material.

16. The element of claim 14, wherein the compensation layer comprises a lower section of a housing for the element.

17. The element of claim 1, wherein the SiO$_2$ layer has a thickness of about 5% to about 15% of the wavelength of the acoustic wave at the center frequency.

18. An element comprising:

a piezoelectric substrate having a first thermal coefficient of expansion and a thickness of x times lambda, where 5<x <50 and lambda is a wavelength of the element at a center frequency;

electrically conducting element structures on an upper side of the substrate;

a compensation layer on an underside of the substrate; and an SiO$_2$ layer over the element structures, wherein the element is configured to be operated using an acoustic wave and the SiO$_2$ layer has a thickness of about 5% to about 20% of a wavelength of the acoustic wave at the center frequency, wherein the compensation layer is mechanically braced with the substrate.

19. The element of claim 18, wherein the compensation layer is configured to form a mechanical bracing with the substrate when there is a temperature change.

* * * * *

UNITED STATES PATENT AND TRADEMARK OFFICE
CERTIFICATE OF CORRECTION

PATENT NO.         : 7,589,452 B2                                          Page 1 of 1
APPLICATION NO.    : 11/574904
DATED              : September 15, 2009
INVENTOR(S)        : Markus Hauser et al.

It is certified that error appears in the above-identified patent and that said Letters Patent is hereby corrected as shown below:

Cover Page, col. 2, (57) ABSTRACT, line 3 after "electric" delete "electric".

Signed and Sealed this

Fifth Day of January, 2010

David J. Kappos
*Director of the United States Patent and Trademark Office*